United States Patent
Horwitz et al.

(10) Patent No.: US 11,025,249 B2
(45) Date of Patent: Jun. 1, 2021

(54) CLAMP FOR A HYBRID SWITCH

(71) Applicant: Power Integrations, Inc., San Jose, CA (US)

(72) Inventors: Hartley Horwitz, Ottawa (CA); Sorin Georgescu, Gilroy, CA (US); Kuo-Chang Robert Yang, Campbell, CA (US)

(73) Assignee: Power Integrations, Inc., San Jose, CA (US)

(*) Notice: Subject to any disclaimer, the term of this patent is extended or adjusted under 35 U.S.C. 154(b) by 0 days.

(21) Appl. No.: 16/935,642

(22) Filed: Jul. 22, 2020

(65) Prior Publication Data
US 2020/0350908 A1   Nov. 5, 2020

Related U.S. Application Data

(60) Continuation of application No. 16/564,850, filed on Sep. 9, 2019, now Pat. No. 10,763,852, which is a (Continued)

(51) Int. Cl.
*H03K 17/081* (2006.01)
*H01L 29/20* (2006.01)
(Continued)

(52) U.S. Cl.
CPC ....... *H03K 17/567* (2013.01); *H01L 29/0619* (2013.01); *H01L 29/866* (2013.01); *H03K 5/08* (2013.01); *H03K 17/08116* (2013.01)

(58) Field of Classification Search
CPC .. H03K 17/567; H03K 5/08; H03K 17/08116; H01L 29/0619; H01L 29/866
See application file for complete search history.

(56) References Cited

U.S. PATENT DOCUMENTS 655,050 A   7/1900  Brown
4,523,111 A   6/1985  Baliga
(Continued)

FOREIGN PATENT DOCUMENTS

DE   1020060299229 B3   9/2007

OTHER PUBLICATIONS

Machine Translation of Abstract for DE 102006029928 B3.
Machine Translation of Specification for DE 102006029928 B3.

*Primary Examiner* — Dinh T Le
(74) *Attorney, Agent, or Firm* — Power Integrations, Inc.

(57) ABSTRACT

A switch having a drain, a source, and a control. The switch comprising a depletion-mode transistor including a first, a second, and a control terminal and an enhancement-mode transistor including a first, a second, and a control terminal. The first terminal of the depletion-mode transistor is the drain of the switch and the control of the depletion-mode transistor is coupled to the source of the switch. The control of the enhancement-mode transistor is coupled to the control of the switch, the second terminal of the enhancement-mode transistor is the source of the switch. The switch comprises a clamp circuit to clamp a voltage of the first terminal of the enhancement-mode transistor to a threshold, the clamp circuit comprises a resistor and a pn-junction device coupled between the first and second terminals of the enhancement-mode transistor and between the second terminal and the control of the depletion-mode transistor.

6 Claims, 5 Drawing Sheets

Related U.S. Application Data continuation of application No. 16/220,684, filed on Dec. 14, 2018, now Pat. No. 10,461,740, which is a continuation of application No. 15/977,689, filed on May 11, 2018, now Pat. No. 10,187,054, which is a continuation of application No. 15/838,171, filed on Dec. 11, 2017, now Pat. No. 9,998,115, which is a division of application No. 15/246,395, filed on Aug. 24, 2016, now Pat. No. 9,871,510.

(51) Int. Cl.
  *H03K 17/567* (2006.01)
  *H03K 5/08* (2006.01)
  *H01L 29/06* (2006.01)
  *H01L 29/866* (2006.01)

(56) References Cited

U.S. PATENT DOCUMENTS

| | | | |
|---|---|---|---|
| 4,683,547 | A | 5/1987 | Baliga et al. |
| 4,945,266 | A | 7/1990 | Mori |
| 5,005,061 | A | 4/1991 | Robb et al. |
| 5,118,635 | A | 6/1992 | Frisina et al. |
| 5,285,369 | A | 2/1994 | Balakrishnan |
| 5,396,085 | A | 3/1995 | Baliga |
| 5,602,724 | A | 2/1997 | Balakrishnan |
| 5,866,461 | A | 2/1999 | Puzzolo et al. |
| 6,127,723 | A | 10/2000 | Aiello et al. |
| 6,157,049 | A | 10/2000 | Mitlehner |
| 6,373,318 | B1 | 4/2002 | Dohnke et al. |
| 6,483,369 | B1 | 11/2002 | Wittenbreder |
| 6,535,050 | B2 | 3/2003 | Baudelot et al. |
| 6,633,195 | B2 | 10/2003 | Baudelot et al. |
| 6,767,783 | B2 | 7/2004 | Casady et al. |
| 6,822,842 | B2 | 11/2004 | Friedrichs et al. |
| 6,979,863 | B2 | 12/2005 | Ryu |
| 7,082,020 | B2 | 7/2006 | Friedrichs et al. |
| 7,095,084 | B2 | 8/2006 | Ronsisvalle |
| 7,206,178 | B2 | 4/2007 | Friedrichs et al. |
| 7,352,202 | B2 | 4/2008 | Billingsley et al. |
| 7,378,912 | B2 | 5/2008 | Tanahashi et al. |
| 7,501,670 | B2 | 3/2009 | Murphy |
| 7,701,279 | B2 | 4/2010 | Scollo et al. |
| 7,719,055 | B1 | 5/2010 | McNutt et al. |
| 7,768,758 | B2 | 8/2010 | Maier et al. |
| 7,777,553 | B2 | 8/2010 | Friedrichs |
| 7,852,137 | B2 | 12/2010 | MacHida et al. |
| 8,084,783 | B2 | 12/2011 | Zhang |
| 8,184,162 | B2 | 4/2012 | Hseih |
| 8,310,281 | B2 | 11/2012 | Draxelmayr |
| 8,400,789 | B2 | 3/2013 | Joshi |
| 8,456,198 | B2 | 6/2013 | Summer |
| 8,598,937 | B2 | 12/2013 | Lal et al. |
| 8,847,235 | B2 | 9/2014 | Rose |
| 8,928,410 | B2 | 1/2015 | Bracale et al. |
| 8,958,189 | B1 * | 2/2015 | Weyers ............... H01L 27/0255 361/91.5 |
| 9,431,391 | B2 * | 8/2016 | Ueno .................. H01L 27/0255 |
| 9,472,549 | B2 | 10/2016 | Rose |
| 9,484,418 | B2 | 11/2016 | Huang |
| 9,748,941 | B2 * | 8/2017 | Kim .................... H01L 27/0883 |
| 9,871,510 | B1 | 1/2018 | Horwitz |
| 9,998,115 | B1 | 6/2018 | Horwitz |
| 10,187,054 | B2 | 1/2019 | Horwitz |
| 2007/0147099 | A1 | 6/2007 | Tai et al. |
| 2008/0174184 | A1 | 7/2008 | Arpilliere et al. |
| 2008/0253151 | A1 | 10/2008 | Bahramian |
| 2008/0258184 | A1 | 10/2008 | Sankin et al. |
| 2011/0101375 | A1 | 5/2011 | Zhang |
| 2011/0254018 | A1 | 10/2011 | Domes et al. |
| 2012/0262220 | A1 | 10/2012 | Springett |
| 2013/0088280 | A1 * | 4/2013 | Lal ..................... H01L 27/0629 327/513 |
| 2014/0292287 | A1 | 10/2014 | Rutter et al. |
| 2015/0043116 | A1 | 2/2015 | Weyers |
| 2017/0092640 | A1 * | 3/2017 | Aoki ..................... H01L 28/20 |

\* cited by examiner

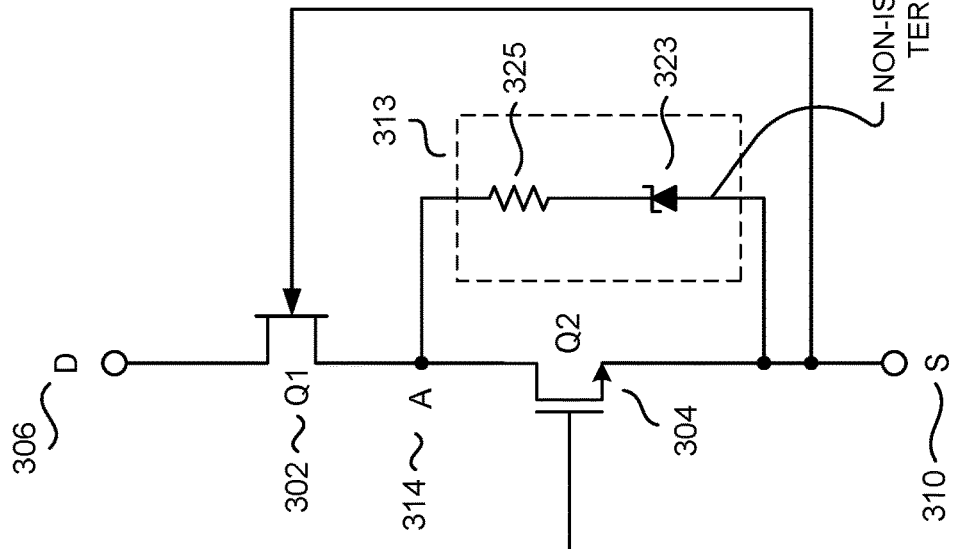
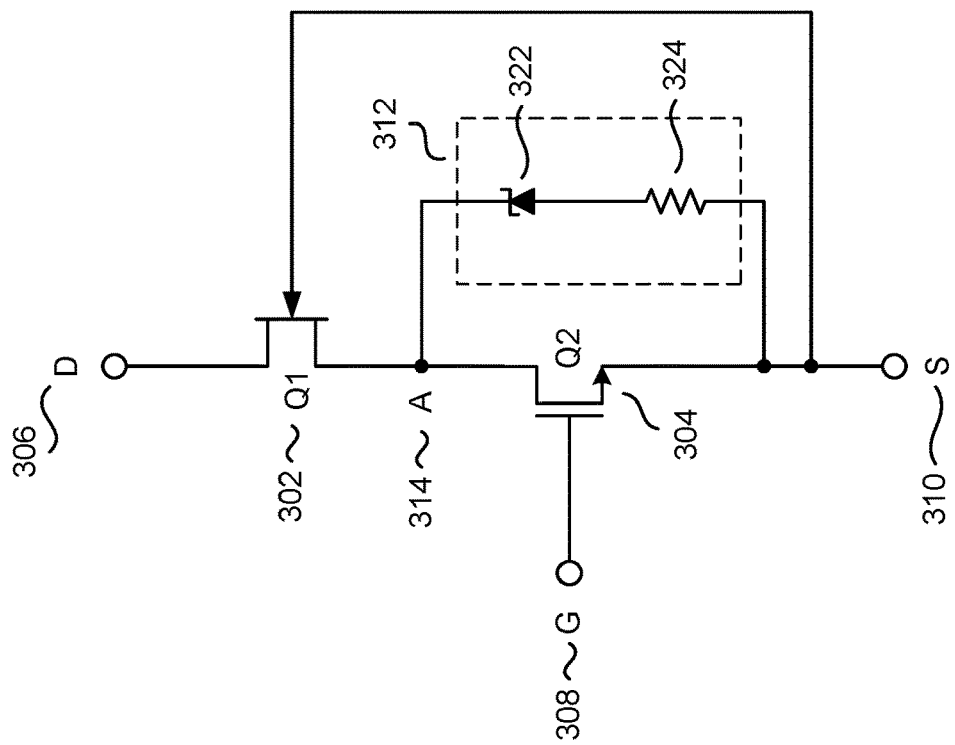
FIG. 3B
FIG. 3A

CLAMP FOR A HYBRID SWITCH

CROSS-REFERENCE TO RELATED APPLICATION

This application is a continuation of U.S. patent application Ser. No. 16/564,850, filed on Sep. 9, 2019, which is a continuation of U.S. patent application Ser. No. 16/220,684, filed on Dec. 14, 2018, now U.S. Pat. No. 10,461,740, which issued on Oct. 29, 2019, which is a continuation of U.S. patent application Ser. No. 15/977,689, filed on May 11, 2018, now U.S. Pat. No. 10,187,054, which issued on Jan. 22, 2019, which is a continuation of U.S. patent application Ser. No. 15/838,171, filed on Dec. 11, 2017, now U.S. Pat. No. 9,998,115, which issued on Jun. 12, 2018, which is a divisional of U.S. patent application Ser. No. 15/246,395, filed Aug. 24, 2016, now U.S. Pat. No. 9,871,510, which issued on Jan. 16, 2018. U.S. patent application Ser. No. 15/564,850, U.S. patent application Ser. No. 16/220,684, U.S. patent application Ser. No. 15/977,689, U.S. patent application Ser. No. 15/838,171, and U.S. patent application Ser. No. 15/246,395 are hereby incorporated by reference in their entirety.

BACKGROUND INFORMATION

Field of the Disclosure

The present invention relates generally to semiconductor devices and more specifically to switches including a normally-off device and a normally-on device in a cascode configuration.

Background

Electronic devices use power to operate. Switched mode power converters are commonly used due to their high efficiency, small size, and low weight to power may of today's electronics. Conventional wall sockets provide a high voltage alternating current. In a switching power converter, the high voltage alternating current (ac) input is converted to provide a well-regulated direct current (dc) output through an energy transfer element. The switched mode power converter usually provides output regulation by sensing one or more inputs representative of one or more output quantities and controlling the output in a closed loop. In operation, a switch is utilized to provide the desired output by varying the duty cycle (typically the ratio of the on time of the switch to the total switching period), varying the switching frequency, or varying the number of pulses per unit time of the switch in a switched mode power converter.

Various semiconductor devices may be used for the switch of the switched mode power converter, such as a metal-oxide-semiconductor field-effect transistor (MOSFET), insulated-gate bipolar transistor (IGBT), or a bipolar junction transistor (BJT). These transistors may be fabricated using silicon (Si), silicon carbide (SiC), or gallium nitride (GaN) technologies.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3A illustrates another example of the leakage clamp circuit of FIG. 1 in accordance with the teachings of the present invention.

FIG. 3B illustrates a further example of the leakage clamp circuit of FIG. 1 in accordance with the teachings of the present invention.

Figure 1:
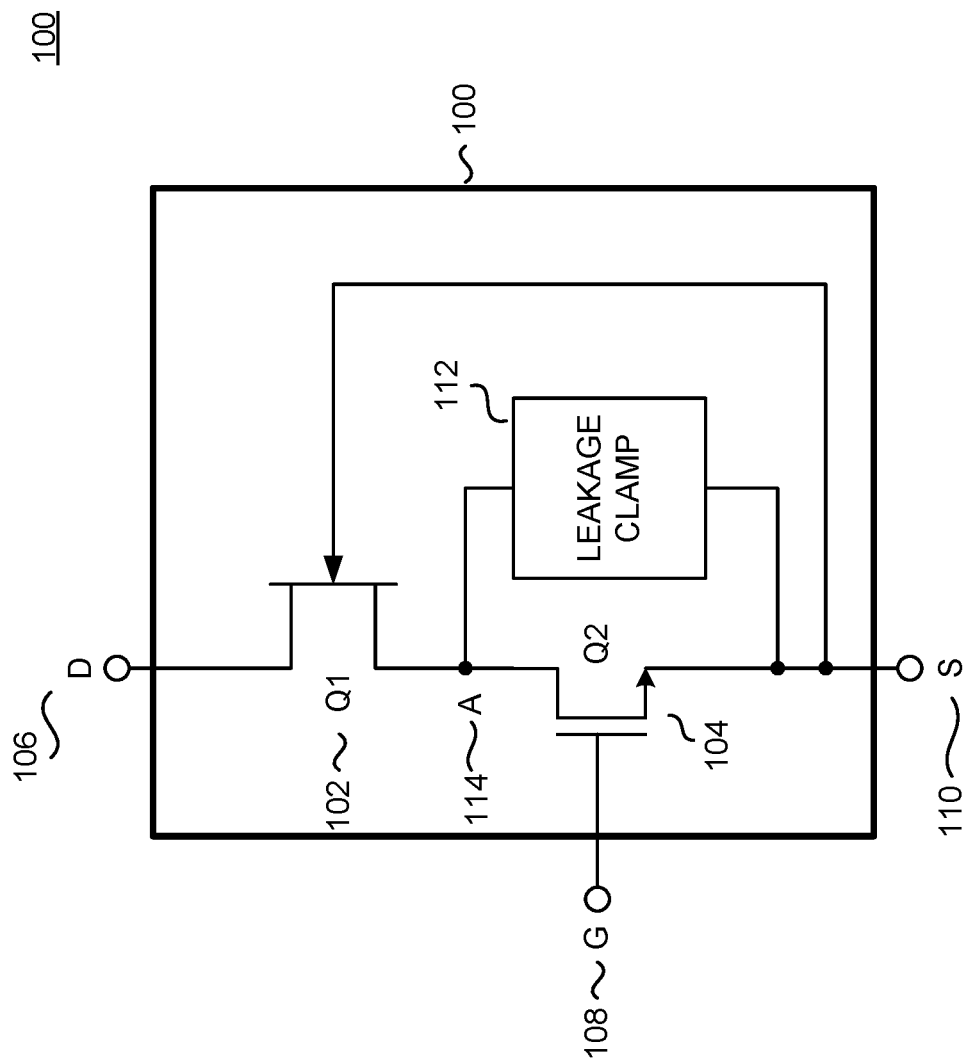
FIG. 1 illustrates a schematic of a switch including a leakage clamp circuit in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

A cascode switch (or a hybrid switch) may include a normally on-device and a normally-off device. The cascode switch has three external terminals, a source, a gate, and a drain. In one example, the normally-on device may be a high-voltage GaN transistor, while the normally-off device may be a low-voltage MOSFET. The source and gate of the normally-off device (e.g., MOSFET) are used as the source and gate of the cascode switch, while the drain of the normally-on device (e.g., GaN transistor) is used as the drain of the cascode switch. The source of the normally-on device (e.g., GaN transistor) is coupled to the drain of the normally-off device (e.g., MOSFET). The normally-off device (e.g., MOSFET) is generally used to turn on and off the normally-on device (e.g., GaN transistor). A switch that is off (or open) cannot conduct current, while a switch that is on (or closed) may conduct current.

During operation, the normally-on device or the normally-off device may have leakage current. If the leakage current of the normally-off device (e.g., MOSFET) is greater than the leakage current of the normally-on device (e.g., GaN transistor), then the voltage at the intermediate terminal between the two devices substantially stays near ground. However, if the leakage current of the normally-on device (GaN transistor) is greater than the leakage current of the normally-off device (MOSFET), then the voltage at the terminal between the two devices may increase, which may potentially damage the cascode switch. A leakage clamp may be used to prevent the voltage at the intermediate terminal between the two devices from increasing to an unsafe level (a voltage above a threshold voltage level). Further, the leakage clamp clamps the voltage between the source terminal and the control terminal of the normally-on device at the threshold voltage level. This keeps the normally-on device off when the normally-on device and the normally-off device are off, and prevents the voltage at the terminal between the two devices from increasing to an unsafe level beyond the threshold voltage level.

FIG. 1 illustrates an example hybrid switch 100 including a normally-on device Q1 102 and a normally-off device Q2 104 coupled together in a cascode configuration in accordance with the teachings of the present invention. The normally-on device Q1 102 is shown as an n-channel junction field-effect transistor (JFET). Further, the normally-on device Q1 102 may be a high-voltage GaN transistor. The normally-on device Q1 102 may also be referred to as a depletion-mode transistor. The normally-off device Q2 104 is shown as an n-channel MOSFET and may also be referred to as an enhancement-mode transistor. Further, the normally-on device Q1 102 may be a high-voltage transistor (e.g., 100V or greater), while the normally-off device Q2 104 may be a low-voltage transistor (e.g., 100V or less).

The hybrid switch 100 includes three terminals, a drain terminal 106, a gate terminal 108, and a source terminal 110. The gate and source terminals of the normally-off device Q2 104 are the gate terminal 108 and source terminal 110, respectively, of the hybrid switch 100. The drain of the normally-on device Q1 102 is the drain terminal of the hybrid switch 100. Further, the source of the normally-on device Q1 102 is coupled to the drain of the normally-off device Q2 104 at an intermediate node A 114 between the normally-on device Q1 102 and the normally-off device Q2 104. As shown, the gate of the normally-on device Q1 102 is also coupled to the source terminal 110. Although the hybrid switch 100 illustrated in FIG. 1 shows no intervening elements between the gate of the normally-on device Q1 102 and the source terminal 110, it is noted that intervening elements may be present (such as a resistor).

The hybrid switch 100 also includes a leakage clamp 112 coupled across the normally-off device Q2 104. One end of the leakage clamp 112 is coupled to the intermediate node A 114, while the other end is coupled to the source terminal S 110. In addition, the leakage clamp 112 is coupled between the source and gate terminals of the normally-on device Q1 102 to clamp the voltage between the source and gate terminals of the normally-on device Q1 102. The leakage clamp 112 may include various components, such as resistors, diodes, and transistors. Further, the leakage clamp 112 may be integrated with the normally-off device Q2 104.

In operation, the normally-off device Q2 104 is used to control the turning on and off of the normally-on device Q1 102. The leakage clamp 112 may also be referred to as a soft clamp, as the primary use for the leakage clamp 112 is for low currents, such as leakage currents. The leakage clamp 112 clamps the voltage at the intermediate node A 114 caused by the leakage currents of both the normally-on device Q1 102 and the normally-off device Q2 104. By clamping the voltage at the intermediate node A 114, the leakage clamp 112 may also help to avoid an excessive source to gate voltage exerted on the normally-on device A1 102 in the case of an imbalance of capacitance between the normally-on device Q1 102 and the normally-off device Q2 104. The leakage clamp 112 clamps the voltage at the intermediate node A to a voltage level that would not raise reliability concerns for the gate of the normally-on device Q1 102. For instance, in one example the leakage clamp 112 clamps the voltage at the intermediate node A to 24 volts (V).

Figure 2:
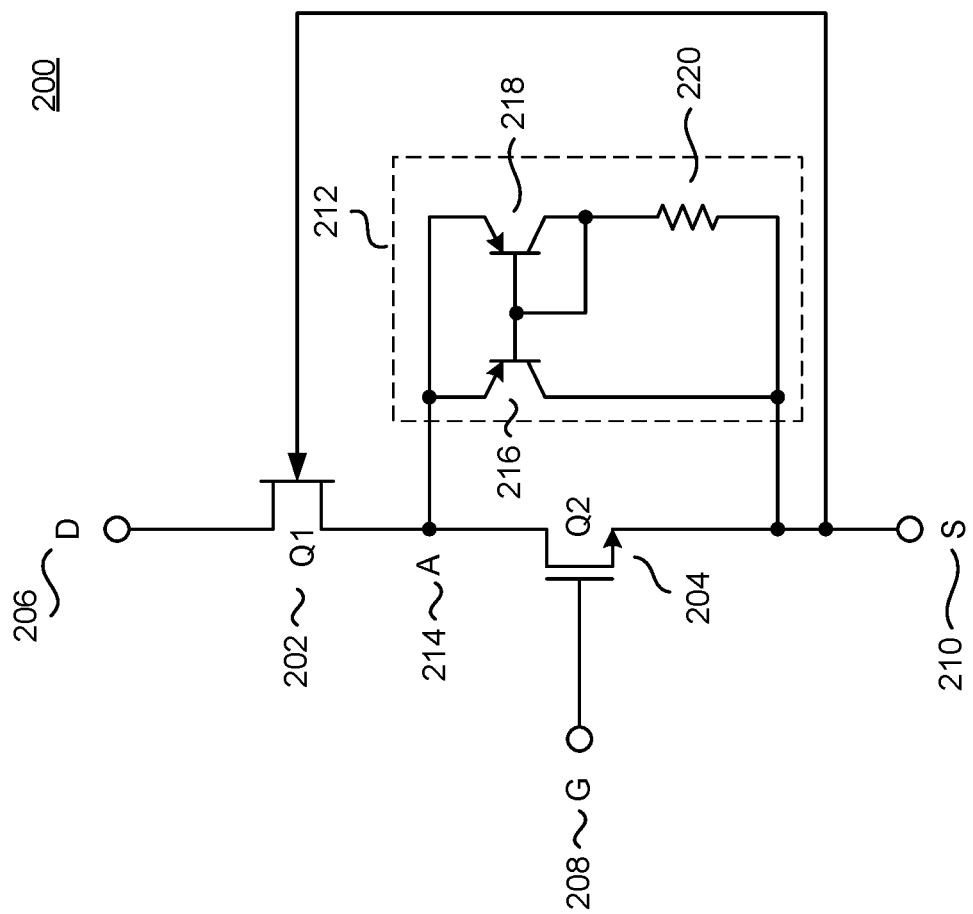
FIG. 2 illustrates one example of the leakage clamp circuit of FIG. 1 in accordance with the teachings of the present invention.

FIG. 2 illustrates an example leakage clamp 212 included in a hybrid switch 200 in accordance with the teachings of the present invention. It is appreciated that the hybrid switch 200 of FIG. 2 may be one example of the hybrid switch 100 of FIG. 1, and that similarly named and numbered elements are therefore coupled and function similarly as described above. As shown in the example depicted in FIG. 2, the leakage clamp 212 is coupled across the normally-off device Q2 204, and includes transistors 216 and 218 and resistor 220. Transistors 216 and 218 are shown as pnp bipolar transistors in FIG. 2. However, it is appreciated that in other examples, npn bipolar transistors may also be used. The emitter terminals of transistors 216 and 218 are coupled to intermediate node A 214, while the base terminals of transistors 216 and 218 are coupled to each other. Further, the collector terminal of transistor 216 is coupled to source terminal 210, while the collector terminal of transistor 218 is coupled to its base terminal. One end of resistor 220 is coupled to the collector terminal of transistor 218, while the other end of resistor 220 is coupled to source terminal 210. In one example, transistor 218 is a lateral pnp bipolar transistor disposed in a semiconductor substrate, and transistor 216 may be a parasitic vertical pnp bipolar transistor disposed in the semiconductor substrate. In this example, transistor 216 may have its collector terminal connected to the semiconductor substrate (in which transistor 216 is disposed), and its base terminal intrinsically part of the base of transistor 218. In other words, transistor 216 may be a parasitic transistor that exists as a result of the construction of transistor 218.

In operation, when the voltage at intermediate node A 214 is low, transistors 216 and 218 are off, and current does not generally flow through leakage clamp 212. When the voltage at intermediate node A 214 rises to a threshold voltage level, transistors 216 and 218 break down in a controlled manner, which clamps the voltage at intermediate node A 214. In particular, when the voltage at intermediate node A 214 reaches the threshold voltage level, transistor 218 turns on allowing current to flow (from intermediate node A 214, through transistor 218, to the source terminal 210), while resistor 220 limits the amount of current that flows from the collector of transistor 218 to the source terminal 210. During operation, the voltage at intermediate node A 214 may fall below ground, and substrate current may occur—in which current is pulled from the substrate (ground terminal). In general, substrate current is unwanted (and should be prevented) since the substrate current may go to other circuits coupled to the hybrid switch 200. The leakage clamp 212 may reduce the likelihood of substrate current.

FIG. 3A illustrates another example of a leakage clamp 312 included in a hybrid switch 300 in accordance with the teachings of the present invention. It is appreciated that the hybrid switch 300 of FIG. 3A may be another example of the hybrid switch 100 of FIG. 1, and that similarly named and numbered elements are therefore coupled and function similarly as described above. As shown in the example depicted in FIG. 3A, the leakage clamp 312 is coupled across the normally-off device Q2 304, and includes a Zener diode 322 and a resistor 324 coupled across normally-off device Q2 304. In the example depicted in FIG. 3A, the cathode end of the Zener diode 322 is directly coupled to intermediate node A 314, while the anode end is directly coupled to the resistor 324. The other end of the resistor 324 is directly coupled to the source terminal 310 of the hybrid switch 300. Although a Zener diode is illustrated in FIG. 3A, it is appreciated that in other examples, other types of diodes may be used instead.

In operation, the voltage at intermediate node A 314 is clamped by the Zener diode 322. If the voltage at intermediate node A 314 exceeds a threshold voltage level, such as the breakdown voltage of the Zener diode 322, current conducts through Zener diode 322 (from intermediate node A 314 to source terminal 310), and the resistor 324 limits the amount of current.

FIG. 3B illustrates another example of the leakage clamp 313 included in a hybrid switch 301 in accordance with the teachings of the present invention. It is appreciated that the hybrid switch 301 of FIG. 3B may be yet another example of the hybrid switch 100 of FIG. 1, and that similarly named and numbered elements are therefore coupled and function similarly as described above. It is also noted that the hybrid switch 301 of FIG. 3B is also similar to the hybrid switch 300 shown in FIG. 3A, with one difference being the relative positioning of the resistor 325 and Zener diode 323 in the leakage clamp 313. In particular, as shown in the example depicted FIG. 3B, the anode of the Zener diode 323 is directly coupled to the source terminal 310, and the cathode of the Zener diode 323 is directly coupled to one end of resistor 325. The other end of resistor 325 is directly coupled to intermediate node A 314 in the depicted example.

In operation, the voltage at intermediate node A 314 is clamped by the Zener diode 323. If the voltage at intermediate node A 314 exceeds the breakdown voltage of the Zener diode 323, current conducts through Zener diode 323 (from node A 314 to source terminal 310), and the resistor 325 limits the amount of current. Since the anode of the Zener diode 323 is directly coupled to the source terminal 310, the construction of the anode terminal of the Zener diode 323 in the semiconductor material of the chip does not have to be isolated from the semiconductor substrate. In other words, the anode terminal of Zener diode 323 is a non-isolated terminal from the semiconductor substrate.

For instance, in an example in which the non-isolated anode terminal of Zener diode 323 is a p-type anode and the semiconductor substrate in which the Zener diode 323 is disposed is a p-substrate, an n-type isolation layer may be removed under the p-type anode junction. The absence of an isolation layer having the opposite polarity (i.e., the absence of the n-type isolation layer to isolate the p-type anode of Zener diode 323 from the p-substrate) eliminates a parasitic npn junction, which significantly reduces or eliminates parasitic npn gain in the device. In addition, the elimination of the parasitic npn junction in Zener diode 323 allows the leakage clamp 313 to handle much higher current and be less susceptible to snapback in accordance with the teachings of the present invention.

While the voltage at intermediate node A 314 may still fall below ground during switching, as would be the case for example during constant current mode zero voltage switching operation, Zener diode 323 would be forward biased and substrate current may still be possible. However, with the anode of the Zener diode 323 being a non-isolated terminal from the substrate, and with resistor 325 coupled between intermediate node A 314 and the cathode of Zener diode 323, the cathode of Zener diode 323 would experience less forward voltage due to the voltage drop through resistor 325. As such, the substrate current through Zener diode 323 is less than the substrate current Zener diodes in other examples. Accordingly, the Zener diode 323 is more immune to substrate current injection current compared to other examples in accordance with the teachings of the present invention.

Figure 4A:
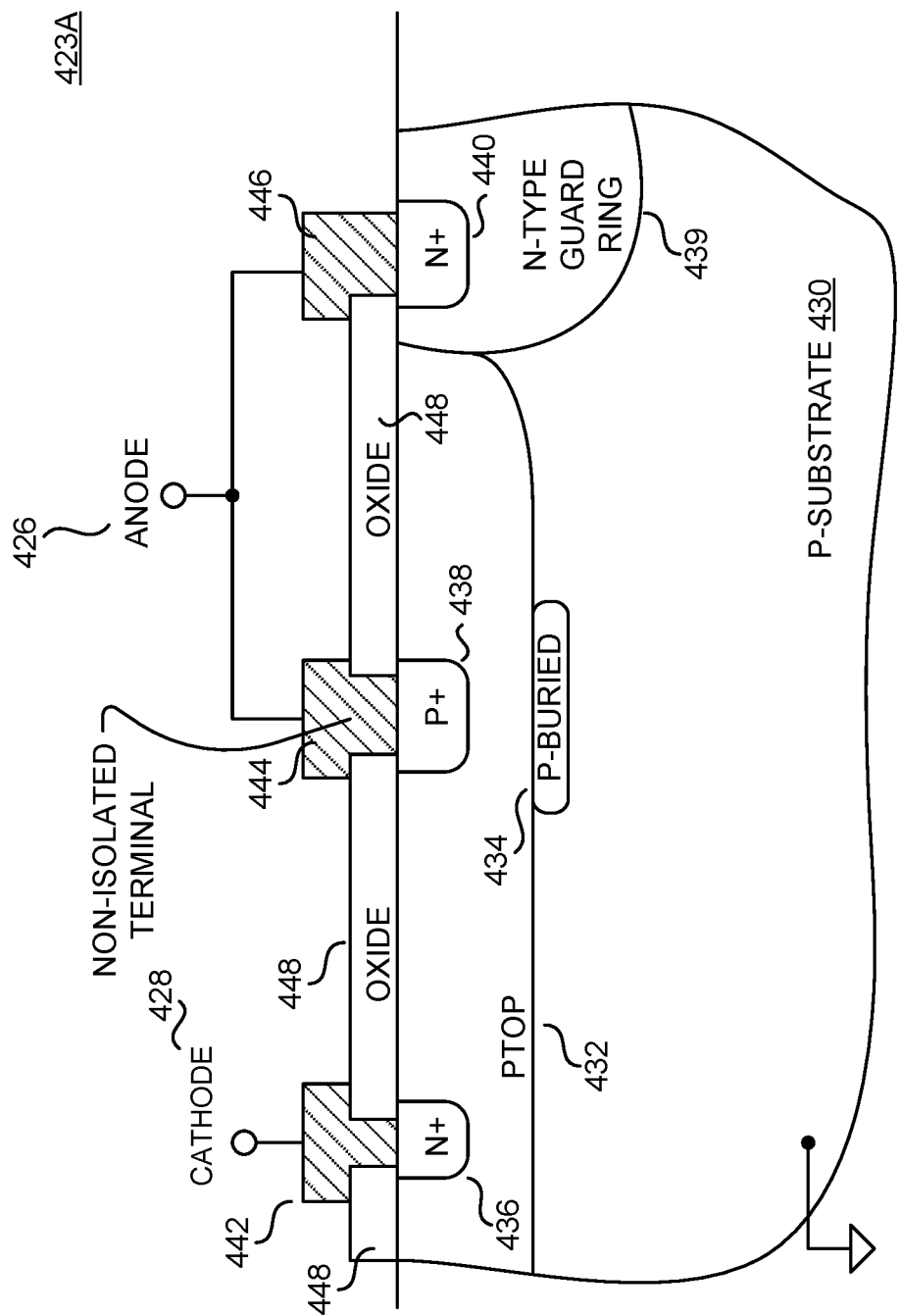
FIG. 4A illustrates an example cross-sectional view of a Zener diode of the leakage clamp circuit of FIG. 3B in accordance with the teachings of the present invention.

FIG. 4A illustrates an example cross section of a Zener diode 423A disposed in semiconductor material, which is one example of Zener diode 323 illustrated in FIG. 3B. Accordingly, similarly named and numbered elements are therefore coupled and function similarly as described above. As shown, the construction of the Zener diode 423A is not isolated from the substrate 430. By not isolating the Zener diode 423A from the substrate 430, snapback may be reduced. In the example, the p-substrate 430 is referenced to ground. A p doped semiconductor region, labeled PTOP layer 432, is disposed in the p-type substrate 430. In one example, the PTOP layer 432 is a region doped with p-type dopants, and having an average doping concentration of about 1e17. Further, a p-buried layer 434 is also disposed in the substrate 430 below the PTOP layer 432. The p-buried layer 434 reduces parasitic npn gain by lowering the base resistance. Although shown, the p-buried layer 434 may be optional. Disposed in the PTOP layer 432 is an n+ doped cathode region 436 and a p+ doped anode region 438, which provide contact to the PTOP layer 432. As shown in the example depicted in FIG. 4A, p-buried layer 434 is directly below, and vertically aligned with, p+ doped anode region 438. Further, the lateral bounds of p-buried layer 434 are larger than the lateral bounds of p+ doped anode region 438. In one example, the n+ doped cathode region 436A may have doping concentration of about 1e19. The p-n junction of Zener diode 423A shown in the example of FIG. 4A is formed at the interface of the PTOP layer 432 and the n+ doped cathode region 436.

Also disposed in the substrate 430 is an n-type guard ring 439, which laterally surrounds the Zener diode 423A. The guard ring 439 provides efficient collection of minority carriers in the substrate during forward injection events, and may be used to improve the reverse recovery of the Zener diode 423A. Disposed in the guard ring 439 is an n+ region 440, which provides contact to the n-type guard ring 439. Metal regions 444 and 446 are disposed atop the p+ doped anode region 438 and the n+ region 440, respectively, to contact to their respective regions. Further, as shown, metal regions 444 and 446 form the anode terminal 426. In other words, the n-type guard ring 439 is shorted to the anode terminal 426 of the Zener diode 423A.

As discussed above, in the depicted example, the anode terminal 426 is a non-isolated terminal from the p-substrate 430. For instance, as shown in the depicted example, anode terminal 426 is coupled to p+ doped anode region 438 through metal region 444, and the semiconductor substrate in which the Zener diode 423A is disposed is a p-substrate 430. Since anode region 438 and substrate 430 have the same polarity dopants (p dopants) and since there is an absence of an n-type isolation layer (i.e., opposite polarity isolation layer from p+ doped anode region 438 and p-substrate 430) between p+ doped anode region 438 and p-substrate 430, the anode terminal 426 is a non-isolated terminal from p-substrate 430. The absence of an isolation layer having the opposite polarity between the anode terminal 426 and the substrate 430 eliminates a parasitic npn junction, which significantly reduces or eliminates parasitic npn gain in the device. In addition, the elimination of the parasitic npn junction in Zener diode 423A allows a leakage clamp including Zener diode 423A to handle much higher current and be less susceptible to snapback in accordance with the teachings of the present invention.

In the example depicted in FIG. 4A, the doping profiles of n-type guard ring 439 and PTOP layer 432 are in direct contact with one another and may even overlap slightly. However, in another example, a space may exist between n-type guard ring 439 and PTOP layer 432. The space may have the same doping profile as p-substrate 430. Further, it should be noted that the n-type guard ring 439 extends further into the substrate than PTOP layer 432 in the depicted example.

Metal region 442 is disposed atop the n+ doped cathode region 436, and provides contact to the n+ doped cathode region 436. As shown, metal region 442 is the cathode terminal 428 of the Zener diode 423A. Oxide layer 448 is shown as disposed atop the PTOP layer 432 and the n-type guard ring 439 between metal regions 442 and 444, and 444 and 446. The oxide layer 448 may be used to protect the device.

Figure 4B:
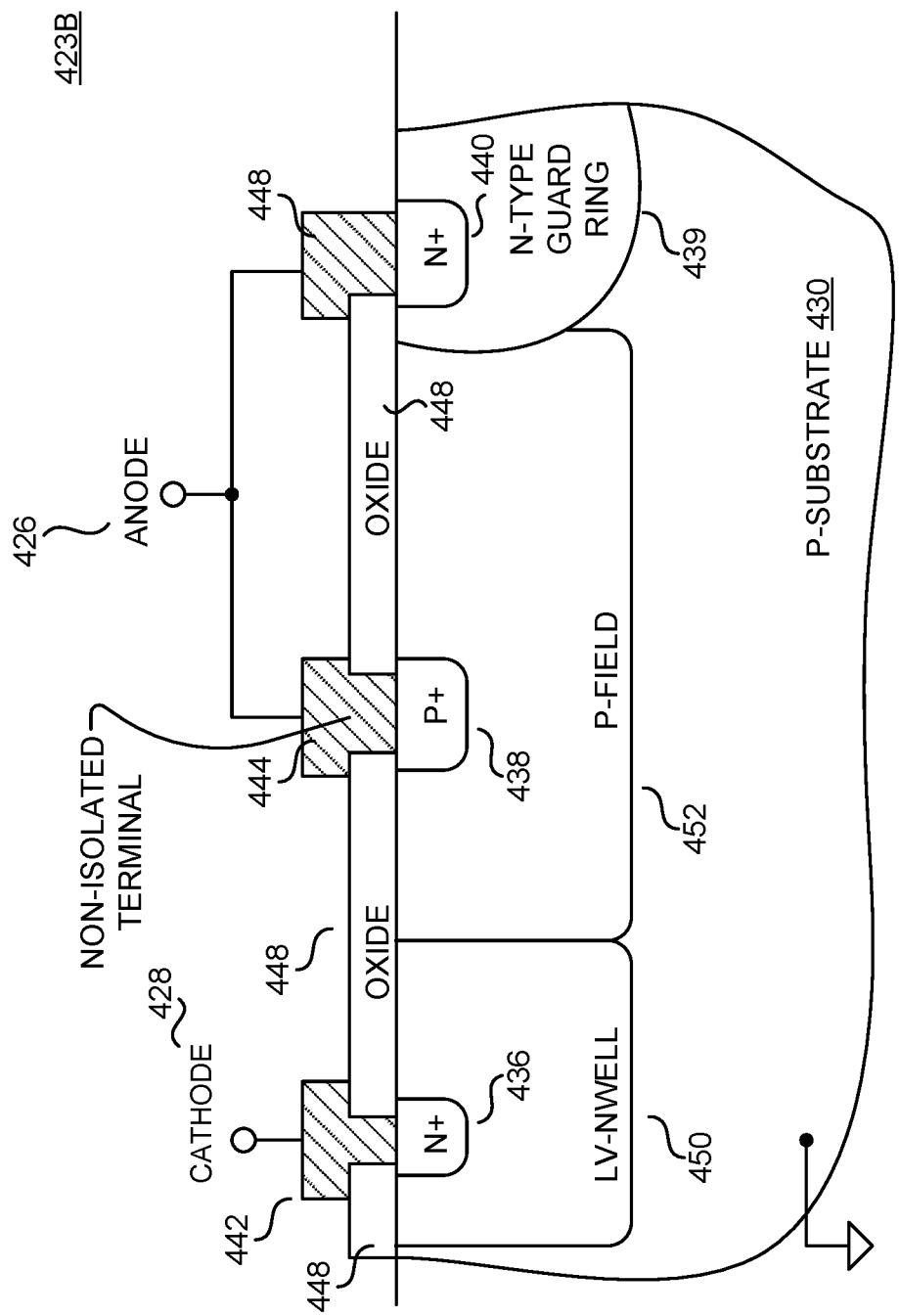
FIG. 4B illustrates another example cross-sectional view of a Zener diode of the leakage clamp circuit of FIG. 3B in accordance with the teachings of the present invention.

FIG. 4B illustrates another example cross section of a Zener diode 423B disposed in semiconductor material, which is another example of Zener diode 323 illustrated in FIG. 3B. In addition, it is appreciated that the cross-section of Zener diode 423B of FIG. 4B shares similarities with the example cross-section of Zener diode 423A of FIG. 4A. Accordingly, similarly named and numbered elements are therefore coupled and function similarly as described above. One difference between Zener diode 423B of FIG. 4B and Zener diode 423A of FIG. 4A is that instead of a PTOP layer 432 disposed in the p-substrate 430 as shown in FIG. 4A, Zener diode 423B of FIG. 4B includes a p doped semiconductor region, labeled p-field region 452, and an n doped semiconductor region, labeled low-voltage nwell (LV-nwell) 450, disposed in the p-substrate 430. In the depicted example, the doping profiles of the p-field region 452 and LV-nwell 450 are in direct contact and may even overlap slightly. In general, the p-field region 452 is disposed deeper into the p-substrate 430 than the PTOP layer 432 of FIG. 4A, and the p-field region 452 has a variable doping profile. In one example, the average doping concentration of p-field region 452 is substantially 1e17.

Further, p+ doped anode region 438 is disposed in the p-field region 452 to provide contact to the p-field region 452, while the n+ doped cathode region 436 is disposed in the LV-nwell 450 to provide contact to the LV-nwell 450. In the example depicted in FIG. 4B, meeting point between the p-field region 452 and LV-nwell 450 is roughly midway between the p+ doped anode region 438 and the n+ doped cathode region 436. For the example of FIG. 4B, the p-n junction of Zener diode 423B is formed at the interface of the p-field region 452 and the LV-nwell 450. As shown, the Zener diode is not isolated from the p-substrate 430, allowing an n-type isolation layer to be removed under the p-type anode terminal 426, thereby reducing parasitic npn gain in the device that allows the Zener diode 423B to handle much higher current without snapback. In the example, the p-substrate 430 is referenced to ground.

Also disposed in the substrate 430 is an n-type guard ring 439, which laterally surrounds the Zener diode 423B. The guard ring 439 provides efficient collection of minority carriers in the substrate during forward injection events, and may be used to improve the reverse recovery of the Zener diode 423B. Disposed in the guard ring 439 is an n+ region 440, which provides contact to the n-type guard ring 439. Metal regions 444 and 446 are disposed atop the p+ doped anode region 438 and the n+ region, respectively, and provide contact to their respective regions. Further, as shown, metal regions 444 and 446 form the anode terminal 426. In other words, the n-type guard ring 439 is shorted to the anode terminal 426 of the Zener diode 423B.

Similar to Zener diode 423A discussed above, the anode terminal 426 of Zener diode 423B is also a non-isolated terminal from the p-substrate 430. For instance, as shown in the example depicted in FIG. 4B, anode terminal 426 is coupled to p+ doped anode region 438 through metal region 444, and the semiconductor substrate in which the Zener diode 423B is disposed is a p-substrate 430. Since anode region 438 and substrate 430 have the same polarity dopants (p dopants) and since there is an absence of an n-type isolation layer (i.e., opposite polarity isolation layer from p+ doped anode region 438 and p-substrate 430) between p+ doped anode region 438 and p-substrate 430, the anode terminal 426 is a non-isolated terminal from p-substrate 430. The absence of an isolation layer having the opposite polarity between the anode terminal 426 and the substrate 430 eliminates a parasitic npn junction, which significantly reduces or eliminates parasitic npn gain in the device. In addition, the elimination of the parasitic npn junction in Zener diode 423B allows a leakage clamp including Zener diode 423B to handle much higher current and be less susceptible to snapback in accordance with the teachings of the present invention.

As shown in the depicted example, n-type guard ring 439 may be in direct contact with the p-field region 452. These two structures may contact each other proximate to n+ region 440. It is also noted that in the depicted example, the depth of the LV-nwell 450, p-field region 452, and guard ring 439 into the substrate is approximately equal.

Metal region 442 is disposed atop the n+ doped cathode region 436 and provides contact to the n+ doped cathode region 436. As shown, metal region 442 is the cathode terminal 428 of the Zener diode 423B. Oxide layer 448 is shown as disposed atop the LV-nwell 450, p-field region 452, and the n-type guard ring 439, between the metal regions 442 and 444, and 444 and 446. The oxide layer 448 may be used to protect the device.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A switch having a drain terminal, a source terminal and a control terminal, the switch comprising:
   a depletion-mode transistor comprising a first terminal, a second terminal, and a control terminal, wherein the first terminal of the depletion-mode transistor is a drain of the switch and the control terminal of the depletion-mode transistor is coupled to the source terminal of the switch;
   an enhancement-mode transistor comprising a first terminal, a second terminal, and a control terminal, wherein the control terminal of the enhancement-mode transistor is coupled to the control terminal of the switch, the second terminal of the enhancement-mode transistor is the source terminal of the switch, and the first terminal of the enhancement-mode transistor is coupled to the second terminal of the depletion-mode transistor; and
   a clamp circuit coupled across the first and second terminals of the enhancement-mode transistor, the clamp circuit configured to clamp a voltage across the first and second terminals of the enhancement-mode transistor to a threshold, wherein the clamp circuit comprises:
      a current limiting resistor coupled between the first and second terminals of the enhancement-mode transistor, and
      a Zener diode coupled to provide a controlled breakdown characteristic, the Zener diode comprising,
         a cathode terminal coupled to one end of the current limiting resistor, wherein an other end of the current limiting resistor is coupled to the second terminal of the depletion-mode transistor and the first terminal of the enhancement-mode transistor, and
         an anode terminal coupled to the second terminal of the enhancement-mode transistor and the control terminal of the depletion-mode transistor, the anode terminal being a non-isolated terminal from a substrate in which the Zener diode is disposed.

2. The switch of claim 1, wherein a doped anode region coupled to the anode terminal of the Zener diode and the substrate have same polarity dopants, wherein there is an absence of an isolation layer having opposite polarity dopants between the doped anode region of the Zener diode and the substrate, and wherein the substrate is referenced to ground.

3. The switch of claim 1, the Zener diode comprising,
   a semiconductor substrate referenced to ground;
   a doped anode region having a first polarity disposed above the semiconductor substrate, wherein the doped anode region is non-isolated from the semiconductor substrate;
   a first doped semiconductor region having the first polarity disposed in the semiconductor substrate, wherein the doped anode region is disposed in the first doped semiconductor region; and
   a doped cathode region having a second polarity.

4. The switch of claim 3, wherein the Zener diode further comprises a second doped semiconductor region having the second polarity disposed in the semiconductor substrate, wherein the doped cathode region is disposed in the second doped semiconductor region, and wherein the p-n junction of the Zener diode is at an interface between the first doped semiconductor region and the second doped semiconductor region.

5. The switch of claim 1, further comprising:
   a first transistor coupled between the first terminal of the enhancement-mode transistor and the current limiting resistor; and
   a second transistor coupled between the first and second terminals of the enhancement-mode transistor, wherein a control terminal of the first transistor is coupled to a control terminal of the second transistor and the current limiting resistor.

6. The switch of claim 5, wherein the first transistor comprises a lateral pnp bipolar transistor disposed in a substrate, wherein the second transistor includes a parasitic vertical pnp bipolar transistor disposed in the substrate, wherein the control terminal of the second transistor is coupled to the substrate, and wherein a base terminal of the second transistor is part of a base terminal of the first transistor.

* * * * *